(12) United States Patent
Kim et al.

(10) Patent No.: US 11,418,217 B2
(45) Date of Patent: Aug. 16, 2022

(54) ERROR CORRECTION CIRCUIT AND ERROR CORRECTION ENCODING METHOD

(71) Applicant: SK hynix Inc., Gyeonggi-do (KR)

(72) Inventors: Dae Sung Kim, Gyeonggi-do (KR); Hyun Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 31 days.

(21) Appl. No.: 17/086,700

(22) Filed: Nov. 2, 2020

(65) Prior Publication Data

US 2021/0376860 A1 Dec. 2, 2021

(30) Foreign Application Priority Data

May 29, 2020 (KR) .................. 10-2020-0065283

(51) Int. Cl.
| | |
|---|---|
| *H03M 13/00* | (2006.01) |
| *H03M 13/15* | (2006.01) |
| *H03M 13/11* | (2006.01) |
| *G06F 12/0882* | (2016.01) |
| *G06F 11/10* | (2006.01) |
| *G11C 16/34* | (2006.01) |
| *H03M 13/29* | (2006.01) |

(52) U.S. Cl.
CPC ..... *H03M 13/1515* (2013.01); *G06F 11/1076* (2013.01); *G06F 12/0882* (2013.01); *G11C 16/3495* (2013.01); *H03M 13/1111* (2013.01); *H03M 13/2942* (2013.01)

(58) Field of Classification Search
CPC ......... H03M 13/1515; H03M 13/2924; H03M 13/1111; H03M 13/2942; G06F 11/1076
See application file for complete search history.

(56) References Cited

U.S. PATENT DOCUMENTS

| | | | | |
|---|---|---|---|---|
| 7,877,662 | B2 * | 1/2011 | Eleftheriou | H03M 13/275 714/779 |
| 8,086,933 | B2 * | 12/2011 | Yamaga | G06F 11/1012 714/755 |
| 8,719,677 | B2 * | 5/2014 | Alrod | G06F 11/1048 714/766 |
| 9,048,873 | B2 * | 6/2015 | Li | H03M 13/611 |
| 9,348,695 | B2 | 5/2016 | Sharon et al. | |
| 9,959,168 | B2 * | 5/2018 | Achtenberg | G06F 11/108 |

(Continued)

FOREIGN PATENT DOCUMENTS

KR 10-1606718 3/2016

*Primary Examiner* — Esaw T Abraham
(74) *Attorney, Agent, or Firm* — IP & T Group LLP

(57) ABSTRACT

The present technology relates to an error correction circuit. According to the present technology, an error correction circuit performing error correction encoding on a plurality of messages to be stored in a memory device includes a first error correction encoder and a second error correction encoder. The first error correction encoder generates a plurality of codewords by performing first error correcting encoding on each of the plurality of messages. The second error correction encoder performs a second error correction encoding operation by performing an exclusive OR operation on symbols of an identical column layer within the codewords. The second error correction encoder determines a data unit as a target of the second error correction encoding operation based on a use period of the memory device.

14 Claims, 13 Drawing Sheets

(56) References Cited

U.S. PATENT DOCUMENTS

| | | | |
|---|---|---|---|
| 10,157,095 B2* | 12/2018 | Otterstedt | G06F 3/0604 |
| 10,333,555 B2* | 6/2019 | Wu | H03M 13/152 |
| 10,635,531 B2* | 4/2020 | Cha | G11C 29/72 |
| 2009/0241009 A1* | 9/2009 | Kong | G06F 11/1072 |
| | | | 714/763 |
| 2017/0255518 A1* | 9/2017 | Achtenberg | G06F 11/108 |
| 2019/0132007 A1* | 5/2019 | Weinberg | G06F 11/1076 |
| 2020/0394102 A1* | 12/2020 | Cha | H01L 25/16 |

* cited by examiner

ERROR CORRECTION CIRCUIT AND ERROR CORRECTION ENCODING METHOD

CROSS-REFERENCE TO RELATED APPLICATION

The present application claims priority under 35 U.S.C. § 119(a) to Korean patent application number 10-2020-0065283, filed on May 29, 2020, which is incorporated herein by reference in its entirety.

BACKGROUND

Field of Invention

The present disclosure relates to an electronic device, and more particularly, to an error correction circuit.

DESCRIPTION OF RELATED ART

A memory system may include a storage medium that temporarily or permanently stores data. During various operations such as write, read, transmission or processing, a data error or data corruption may occur.

In order to ensure reliability of the data, the memory system may use error correction techniques such as error correction encoding and error correction decoding.

SUMMARY

Embodiments of the present disclosure provide an error correction circuit capable of differently applying an RAID technique according to the circuit's error correction capability.

According to an embodiment of the present disclosure, an error correction circuit performing error correction encoding on a plurality of messages to be stored in a memory device includes a first error correction encoder and a second error correction encoder. The first error correction encoder generates a plurality of codewords by performing first error correcting encoding on each of the plurality of messages. The second error correction encoder performs a second error correction encoding operation by performing an exclusive OR operation on symbols of an identical column layer within the codewords. The second error correction encoder determines a data unit as a target of the second error correction encoding operation based on a use period of the memory device.

According to another embodiment of the present disclosure, a method of performing an error correction encoding on a plurality of messages to be stored in a memory device includes generating a plurality of codewords by performing first error correcting encoding on each of the plurality of messages, and performing a second error correction encoding operation of performing an exclusive OR operation on symbols of an identical column layer within the codewords. A data unit as a target of the second error correction encoding operation is determined based on a use period of the memory device.

According to another embodiment of the present disclosure, an operating method of an error correction encoder including performing a first error correction encoding operation on a message to generate a plurality of codewords, grouping the codewords into a plurality of groups, a number of the codewords in each of the groups depending on a use period of a memory device, and performing a second error correction encoding operation on the respective groups to generate a plurality of maximum distance separable (MDS) codewords. The MDS codewords are to be stored into the memory device.

According to the present technology, RAID techniques having different resource consumption may be applied according to error correction capability, and thus efficient use of resources may be achieved.

DETAILED DESCRIPTION

Specific structural and functional description is provided herein to describe embodiments of the present invention. The present invention, however, may be carried out in various ways and configured in various forms. Thus, the present invention is not limited to or by any of the disclosed embodiments, nor to any specific detail herein. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
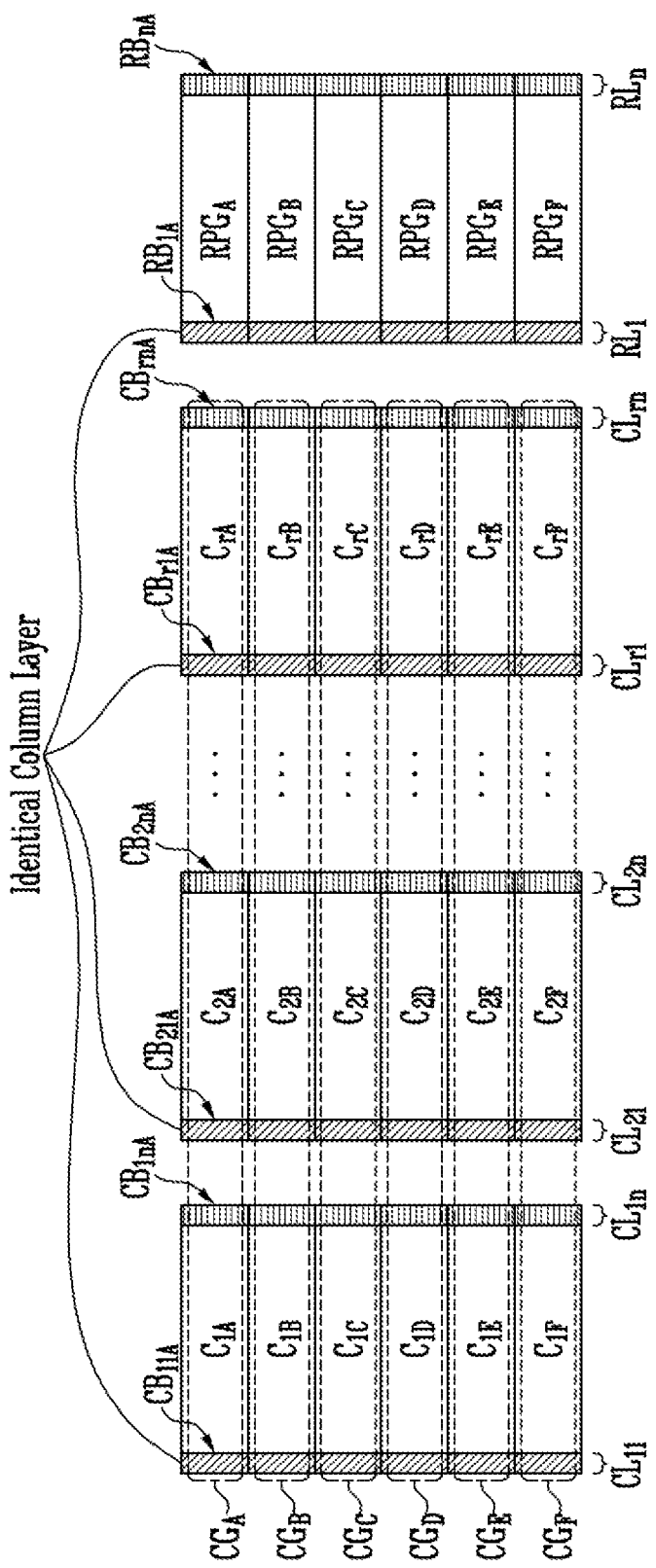
FIG. 1 is an exemplary diagram illustrating a redundant array of independent disk (RAID) technique according to an embodiment of the present disclosure.

FIG. 1 is an exemplary diagram illustrating a RAID technique according to an embodiment of the present disclosure.

During first error correction encoding, a plurality of codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$ may be generated based on a plurality of messages. Each of the plurality of codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$ may be generated based on a generator matrix of the message and an error correction code (ECC). The generated codewords $C_1$ to $C_r$ may be stored in a page unit in a memory device.

During first error correction decoding, error correction decoding may be performed on a target codeword among the codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$ provided from a memory device and a parity check matrix of the ECC. When the number of error bits included in the target codeword exceeds an error correction capability, the error correction decoding may fail.

In order to improve the error correction capability, a redundant array of independent disk (RAID) technique may be applied.

When the RAID technique is applied, second error correction encoding may be performed on each of row-codeword groups $CG_A$ to $CG_F$ respectively including the plurality of codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$.

As an example, the second error correction encoding may be performing by performing an exclusive OR operation on symbols of an identical column layer among symbols included in codewords included in the same row-codeword group. As the second error correction encoding is performed, RAID parity symbol groups $RPG_A$ to $RPG_F$ respectively corresponding to the row-codeword groups $CG_A$ to $CG_F$ may be generated.

For example, the codeword $C_{1A}$ may include first $CB_{11A}$ to n-th bits $CB_{1nA}$, and the codeword $C_{2A}$ may include first $CB_{21A}$ to n-th bits $CB_{2nA}$. Similarly, the codeword $C_{rA}$ may include first $CB_{r1A}$ to n-th bits $CB_{rnA}$. Among the bits of each of the codewords $C_{1A}$ to $C_{rA}$ of the row-codeword group $CG_A$, a first bit $RB_{1A}$ of a first column layer $RL_1$ of a RAID parity symbol group $RPG_A$ may be generated by performing an exclusive OR operation on first bits $CB_{11A}$, $CB_{21A}$, ..., and $CB_{r1A}$ of first column layers $CL_{11}$, $CL_{21}$, ..., and $CL_{r1}$. In addition, a second bit $RB_{2A}$ of a second column layer $RL_2$ of the RAID parity symbol group $RPG_A$ may be generated by performing an exclusive OR operation on second bits $CB_{12A}$, $CB_{22A}$, ..., and $CB_{r2A}$ of second column layers $CL_{12}$, $CL_{22}$, ..., and $CL_{r2}$. In the same manner, an n-th bit $RBn_n$ of an n-th column layer $RL_n$ of the RAID parity symbol group $RPG_A$ may be generated by performing an exclusive OR operation on n-th bits $CB_{1nA}$, $CB_{2nA}$, ..., and $CB_{rnA}$ of n-th column layers $CL_{1n}$, $CL_{2n}$, ..., and $CL_m$. That is, each of bits included in the RAID parity symbol group $RPG_A$ may be generated by performing an exclusive OR operation on bits of the same position among bits included in the codewords $C_{1A}$ to $C_{rA}$. In this case, symbols of the identical column layer may correspond to bits of the same position in each of the codewords. The above-described operation may be performed on each of other row-codeword groups $CG_B$ to $CG_F$ to generate each of RAID parity symbol groups $RPG_B$ to $RPG_F$.

The generated RAID parity symbol groups $RPG_B$ to $RPG_F$ may be stored in the memory device together with the codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$.

During the first error correction decoding, when the first error correction decoding on the target codeword $C_{1A}$ among the codewords $C_{1A}$ to $C_{rA}$ of the row-codeword group $CG_A$ failed, the first error correction decoding may be performed on the remaining codewords $C_{2A}$ to $C_{rA}$ of the row-codeword group $CG_A$ and the RAID parity symbol group $RPG_A$ corresponding to the row-codeword group $CG_A$. When all first error correction decoding on the remaining codewords $C_{2A}$ to $C_{rA}$ and the RAID parity symbol group $RPG_A$ corresponding to the row-codeword group $CG_A$ are successful, the target codeword $C_{1A}$ may be recovered by the second decoding operation of performing an exclusive OR operation on symbols of the identical column layer among the decoded codewords $C_{2A}$ to $C_{rA}$ and the decoded RAID parity symbol group $RPG_A$.

Among the codewords included in the same row-codeword group $CG_A$, when the first error correction decoding on two or more codewords (for example, $C_{1A}$ and $C_{2A}$) failed, the codewords (for example, $C_{1A}$ and $C_{2A}$) may not be recovered.

Figure 2:
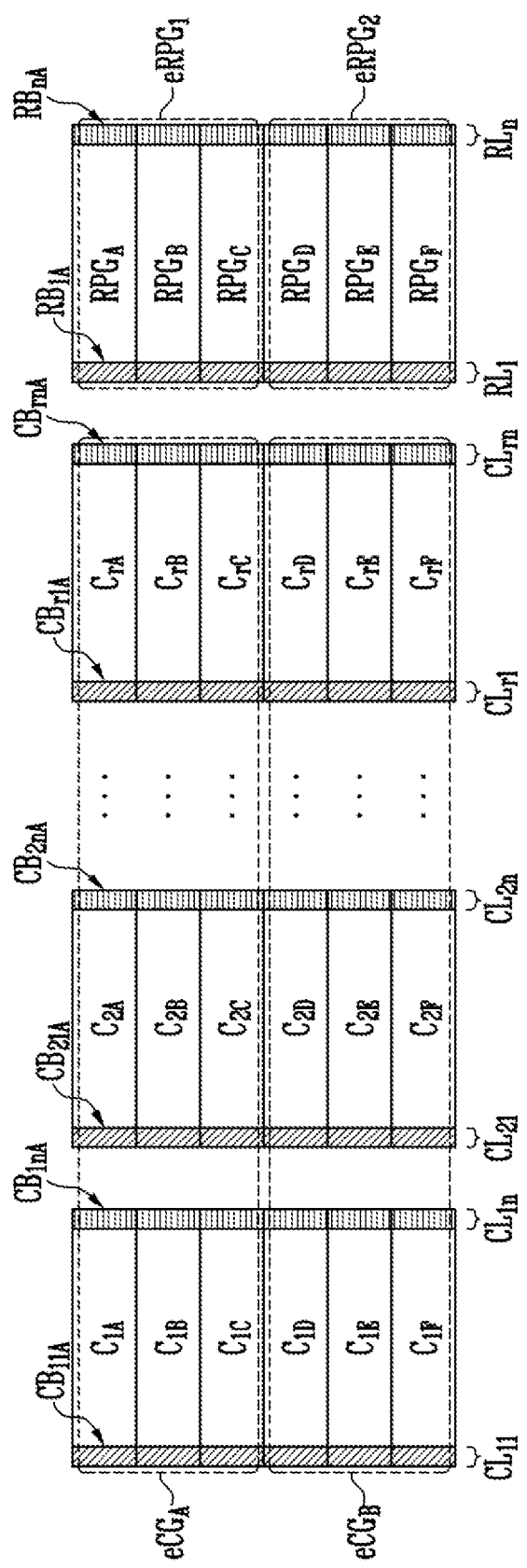
FIG. 2 is an exemplary diagram illustrating a RAID technique according to an embodiment of the present disclosure.

FIG. 2 is an exemplary diagram illustrating a RAID technique according to an embodiment of the present disclosure.

The first error correction encoding and the first error correction decoding may be performed the same as described with reference to FIG. 1 except that the number of symbols included in one column layer is changed; thus, further detailed description of that aspect is omitted here.

The second error correction encoding may be performed on each of row-codeword groups $eCG_A$ and $eCG_B$. The row-codeword groups $eCG_A$ may include a plurality of codewords $C_{1A}$ to $C_{rA}$, $C_{1B}$ to $C_{rB}$, and $C_{1C}$ to $C_{rC}$ and the row-codeword group $eCG_B$ may include a plurality of codewords $C_{1D}$ to $C_{rD}$, $C_{1E}$ to $C_{rE}$, and CiF to $C_{rF}$. Therefore, the number of codewords included in each of the row-codeword groups $eCG_A$ and $eCG_B$, which are described in FIG. 2, is greater than the number of codewords included in each of the row-codeword groups $CG_A$ to $CG_F$ described in FIG. 1. As the second error correction decoding is performed, expanded RAID parity symbol groups 1 and 2 $eRPG_1$ and $eRPG_2$ respectively corresponding to the row-codeword groups $eCG_A$ and $eCG_B$ may be generated. The expanded RAID parity symbol group 1 $eRPG_1$ may include RAID parity symbol groups $RPG_A$, $RPG_B$, and $RPG_C$. In addition, the expanded RAID parity symbol group 2 $eRPG_2$ may include RAID parity symbol groups $RPG_D$, $RPG_E$, and $RPG_F$.

As an example, the second error correction encoding may include a process of performing an exclusive OR operation of symbols of the identical column layer among symbols included in the codewords included in the same row-codeword group. Therefore, the expanded RAID parity symbol group 1 $eRPG_1$ corresponding to the row-codeword group $eCG_A$ may be generated, and the expanded RAID parity symbol group 2 $eRPG_2$ corresponding to the row-codeword group $eCG_B$ may be generated.

For example, the codeword $C_{1A}$ may include first bit $CB_{11A}$ to n-th bit $CB_{1nA}$, the codeword $C_{2A}$ may include first bit $CB_{21A}$ to n-th bit $CB_{2nA}$, and the codeword $C_{rA}$ may include first bit $CB_{r1A}$ to n-th bit $CB_{rnA}$. In addition, the codeword $C_{1B}$ may include first bit $CB_{11B}$ to n-th bit $CB_{1nB}$, the codeword $C_{2B}$ may include first bit $CB_{21B}$ to n-th bit $CB_{2nB}$, and the codeword $C_{rB}$ may include first bit $CB_{r1B}$ to n-th bit $CB_{rnB}$. The codeword $C_{1C}$ may include first bit $CB_{11C}$ to n-th bit $CB_{1nC}$, the codeword $C_{2C}$ may include first bit $CB_{21C}$ to n-th bit $CB_{2nC}$, and the codeword $C_{rC}$ may include first bit $CB_{r1C}$ to n-th bit $CB_{rnC}$.

A first bit $RB_{1A}$ of a first column layer $RL_1$ of the RAID parity symbol group $RPG_A$ may be generated by performing an exclusive OR operation on first bits $CB_{11A}$, $CB_{21A}$, ..., $CB_{r1A}$, $CB_{11B}$, $CB_{21B}$, ..., $CB_{r1B}$, $CB_{11C}$, $CB_{21C}$, ..., and $CB_{r1C}$ of first column layers $CL_{11}$, $CL_{21}$, ..., and $CL_{r1}$ among bits of each of the codewords $C_{1A}$ to $C_{rA}$, $C_{1B}$ to $C_{rB}$, and $C_{1C}$ to $C_{rC}$ of the row-codeword group $eCG_A$. In addition, a second bit $RB_{2A}$ of a second column layer $RL_2$ of the RAID parity symbol group $RPG_A$ may be generated by performing an exclusive OR operation on second bits $CB_{12A}$, $CB_{22A}$, ..., $CB_{r2A}$, $CB_{12B}$, $CB_{22B}$, ..., $CB_{r2B}$, $CB_{12C}$, $CB_{22C}$, ..., and $CB_{r2C}$ of second column layers $CL_{12}$, $CL_{22}$, ..., and $CL_{r2}$ among bits of each of the codewords $C_{1A}$ to $C_{rA}$, $C_{1B}$ to $C_{rB}$, and $C_{1C}$ to $C_{rC}$ of the row-codeword group $eCG_A$. In the same manner, an n-th bit $RBn_A$ of an n-th column layer $RL_n$ of the RAID parity symbol group $RPG_A$ may be generated by performing an exclusive OR operation on n-th bits $CB_{1nA}$, $CB_{2nA}$, ..., $CB_{rnA}$, $CB_{1nB}$, $CB_{2nB}$, ..., $CB_{rnB}$, $CB_{1nC}$, $CB_{2nC}$, ..., and $CB_{rnC}$ of n-th column layers $CL_{1n}$, $CL_{2n}$, ..., and $CL_{rn}$ among bits of each of the codewords $C_{1A}$ to $C_{rA}$, $C_{1B}$ to $C_{rB}$, and $C_{1C}$ to $C_{rC}$ of the row-codeword group $eCG_A$.

That is, each of the bits included in the RAID parity symbol group $RPG_A$ of the expanded RAID parity symbol group 1 $eRPG_1$ may be generated by performing an exclusively OR operation on bits of the same column position among the bits included in the row-codeword groups $eCG_A$. In this case, symbols of the identical column layer may correspond to bits of the same column position in each of the codewords. The above-described operation may be performed on each of the bits included in another row-codeword groups $eCG_B$ to generate RAID parity symbol group $RPG_D$.

The second error correction encoding may be performed based on a generator matrix of a maximum distance separable (MDS) code with symbol groups including the symbols of the identical column layer among the symbols included in the codewords included in the same row-codeword group. For example, the generator matrix of the MDS code may include a message part and a parity part, and the parity part may be used to generate the RAID parity symbol groups $RPG_B$ and $RPG_C$ within the expanded RAID parity symbol group 1 $eRPG_1$ corresponding to the expanded row-codeword group $eCG_A$. The MDS code may be, for example, a Reed-Solomon (RS) code, a doubly extended RS code, or a triply extended RS code.

As described earlier, among the RAID parity symbol groups $RPG_A$, $RPG_B$, and $RPG_C$ included in the expanded RAID parity symbol group 1 $eRPG_1$, the RAID parity symbol group $RPG_A$ may be generated by performing the exclusively OR operation on the symbols of the identical column layer. In addition, among the RAID parity symbol groups $RPG_A$, $RPG_B$, and $RPG_C$ included in the expanded RAID parity symbol group 1 $eRPG_1$, the RAID parity symbol groups $RPG_B$ and $RPG_C$ may be generated by Reed-Solomon error correction encoding. More specifically, the RAID parity symbol groups $RPG_B$ and $RPG_C$ may be generated through a Galois Field operation.

During the first error correction decoding, when the first error correction decoding on the target codeword $C_{1A}$ among the codewords $C_{1A}$ to $C_{rA}$, $C_{1B}$ to $C_{rB}$, and $C_{1C}$ to $C_{rC}$ of the expanded row-codeword group $eCG_A$ failed, the first error correction decoding may be performed on the remaining codewords $C_{2A}$ to $C_{rA}$, $C_{1B}$ to $C_{rB}$, and $C_{1C}$ to $C_{rC}$ of the expanded row-codeword group $eCG_A$ and the corresponding RAID parity symbol group $RPG_A$. When all first error correction decoding on the remaining codewords $C_{2A}$ to $C_{rA}$, $C_{1B}$ to $C_{rB}$, and $C_{1C}$ to $C_{rC}$ and the RAID parity symbol group $RPG_A$ are successful, the target codeword $C_{1A}$ may be recovered by performing an exclusive OR operation on the symbols of the identical column layer among the decoded codewords $C_{2A}$ to $C_{rA}$, $C_{1B}$ to $C_{rB}$, and $C_{1C}$ to $C_{rC}$ and the decoded RAID parity symbol group $RPG_A$.

However, among the codewords included in the same expanded row-codeword group $eCG_A$, when the first error correction decoding on two or more target codewords (for example, $C_{1A}$ and $C_{2A}$) failed, the target codewords (for example, $C_{1A}$ and $C_{2A}$) may not be recovered using only the RAID parity symbol group $RPG_A$. In this case, the second error correction decoding may be performed on the target codewords (for example, $C_{1A}$ and $C_{2A}$) on which the first error correction decoding failed, by further using the RAID parity symbol groups $RPG_B$ and $RPG_C$. In this case, even though the first error correction decoding on the two or more target codewords (for example, $C_{1A}$ and $C_{2A}$) failed among the codewords $C_{1A}$ to $C_{rA}$, $C_{1B}$ to $C_{rB}$, and $C_{1C}$ to $C_{rC}$ included in the same expanded row-codeword group $eCG_1$, the target codewords (for example, $C_{1A}$ and $C_{2A}$) may be recovered through an erasure decoding of the MDS code.

A large amount of resources (for example, power or a computational overhead) may be consumed depending on the error correction technique applied during the error correction encoding and the error correction decoding. The resource consumption may increase as error correction capability increases. When the error correction technique is applied differently according to the error correction capability, efficient use of resources may be achieved. For example, when a use period of the memory device[1], that is, the amount of time that memory device has been used during its life[2] is not long, expected error occurrence is relatively low; thus, the second error correction encoding and decoding method as described with reference to FIG. 1 may be used. That is, during the early stage of life of the memory device, error correction encoding and decoding may be performed according to a relatively small data unit. In this case, since relatively less resources are consumed for error correction, power consumption may be reduced and an operation speed may be improved. On the other hand, as the memory device reaches later stages in its lifespan, expected error occurrence is relatively large due to deterioration of element(s) in the memory device; thus, the second error correction encoding and decoding method as described with reference to FIG. 2 may be used. That is, toward the end life of the memory device, error correction encoding and decoding may be performed according to a relatively large data unit. In this case, since a relatively large amount of resources are consumed for error correction, error correction capability may be improved.

Figure 3:
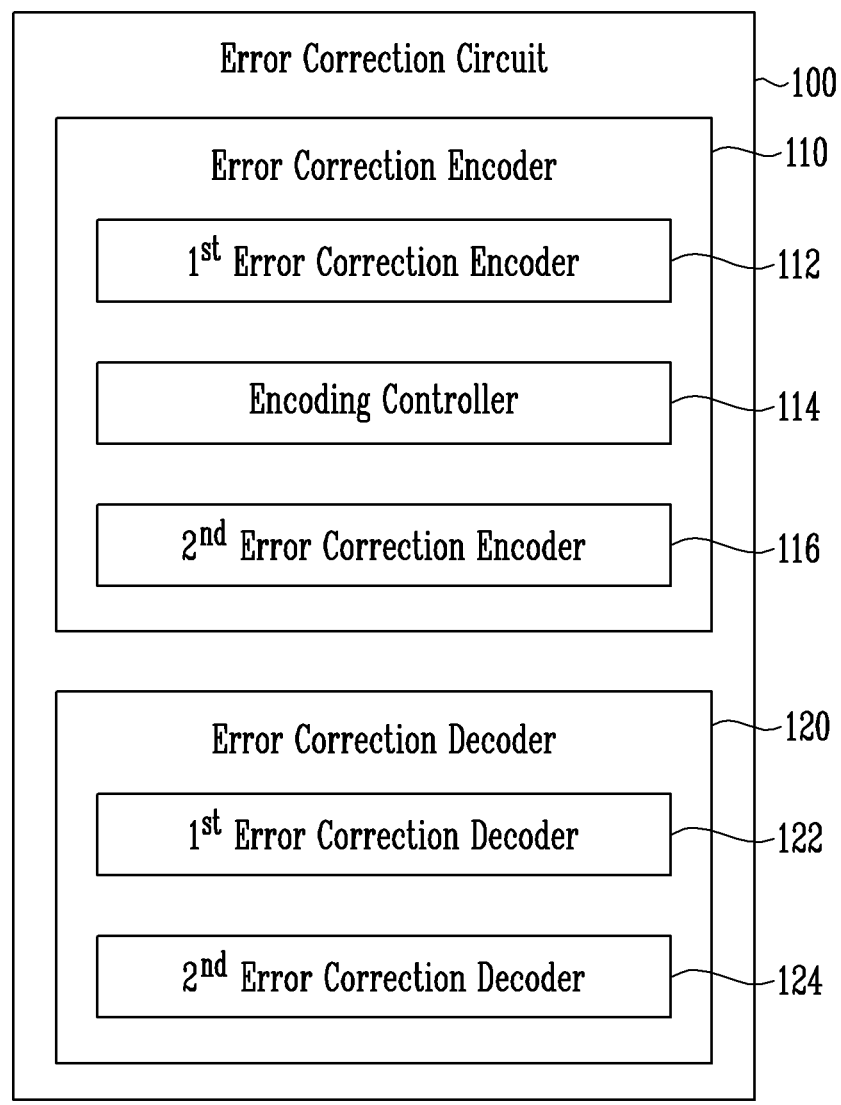
FIG. 3 is an exemplary diagram illustrating an error correction circuit according to an embodiment of the present disclosure.

FIG. 3 is an exemplary diagram illustrating an error correction circuit according to an embodiment of the present disclosure.

The error correction circuit 100 may include an error correction encoder 110 and an error correction decoder 120.

The error correction encoder 110 may perform error correction encoding based on original messages. The error correction encoder 110 may apply an error correction encoding technique differently according to the error correction capability. The error correction encoder 110 may include a first error correction encoder 112, an encoding controller 114, and a second error correction encoder 116.

The first error correction encoder 112 may generate a plurality of row-codewords $C_{1A}$ to $C_{rA}$, $C_{1B}$ to $C_{rB}$, $C_{1C}$ to $C_{rC}$, $C_{1D}$ to $C_{rD}$, $C_{1E}$ to $C_{rE}$, and $C_{1F}$ to $C_{rF}$ by performing first error correction encoding based on a plurality of original messages and a generator matrix of an error correction code. For example, the first error correction encoder 112 may perform the first error correction encoding based on the generator matrix of a low density parity check code.

The encoding controller 114 may generate a plurality of row-codeword groups by grouping the plurality of row-codewords by 'p' ('p' is a natural number). Here, the 'p' row-codewords included in each of the row-codeword groups may be determined differently according to the error correction capability. For example, the encoding controller 114 may determine the 'p' row-codewords included in each of the row-codeword groups $CG_A$ to $CG_F$ such that 'p' increases as the error correction capability increases. For example, in FIG. 1, 'p' may be 'r'. In addition, in FIG. 2, 'p' may be '3r.'

The second error correction encoder 116 may configure 'q' symbol groups each including 'p' symbols of an identical column layer among symbols included in the 'p' row-codewords included in a row-codeword group. Each of the symbols may be a w-bit symbol. Here, the number 'w' may be a natural number. One column layer may include 'w' columns.

The second error correction encoder 116 may generate a RAID parity symbol group (e.g., the RAID parity symbol groups $RPG_A$) by performing the second error correction encoding on the 'p' symbol groups within a row-codeword group. A RAID parity symbol group may be generated from a row-codeword group.

For an example, as illustrated in FIG. 1, the number of RAID parity symbol groups (e.g., the RAID parity symbol group $RPG_A$) corresponding to a single row-codeword group (e.g., the row-codeword group $CG_A$) depends on the number of codewords (e.g., the codewords $C_{1A}$ to $C_{rA}$) within the single row-codeword group (e.g., the row-codeword group $CG_A$).

For example, as illustrated in FIG. 2, the number of RAID parity symbol groups (e.g., the RAID parity symbol groups $RPG_A$, $RPG_B$, and $RPG_C$) within a single expanded RAID parity symbol group (e.g., the expanded RAID parity symbol group 1 $eRPG_1$) corresponding to a single row-codeword group (e.g., the row-codeword group $eCG_A$) depends on the number of codewords (e.g., the codewords $C_{1A}$ to $C_{rA}$, $C_{1B}$ to $C_{rB}$, $C_{1C}$ to $C_{rC}$) within the single row-codeword group (e.g., the row-codeword group $eCG_A$).

The generator matrix of the MDS code may be used for the second error correction encoding. This may mean that one symbol group and one or more RAID parity symbols corresponding to the one symbol group configure one MDS codeword, which is described with reference to FIGS. 7 and 9.

The error correction encoder 110 may output, to a channel, the generated row-codeword groups and the RAID parity symbol groups corresponding to the row-codeword groups, that is a single expanded row-codeword group (e.g., the expanded row-codeword group $eCG_A$ comprising the row-codeword groups $CG_A$ to $CG_C$) and a corresponding expanded RAID parity symbol group (e.g., the expanded RAID parity symbol group 1 $eRPG_1$ comprising the RAID parity symbol groups $RPG_A$, $RPG_B$, and $RPG_C$).

The error correction decoder 120 may perform error correction decoding based on a row-codeword received from the channel. The row-codeword received from the channel may be read from a memory device and then transferred through the channel, and one or more errors may occur in the row-codeword during the storage in the memory device and/or the transfer through the channel. Hereinafter, the row-codeword received from the channel as a target of the error decoding operation is referred to as a target codeword. The target codeword may be different from an original row-codeword that is just output from the error correction encoder 110 since the original row-codeword has not yet entered the channel or the memory device and thus contains no error. The error correction decoder 120 may include a first error correction decoder 122 and a second error correction decoder 124.

The first error correction decoder 122 may receive, from a channel, the target codeword corresponding to any one row-codeword among a plurality of original row-codewords generated by the error correction encoder 110 and may perform first error correction decoding on the target codeword. For example, the first error correction decoder 122 may perform the first error correction decoding on the target codeword based on the parity check matrix of the LDPC code.

The first error correction decoder 122 may output a decoded codeword when the first error correction decoding on the target codeword is successful.

When the first error correction decoding on the target codeword failed, the first error correction decoder 122 may receive reference codewords from the channel. The reference codewords are remaining row-codewords other than the target codeword within a single row-codeword group (e.g., the row-codeword group $CG_A$) or a single expanded row-codeword group (e.g., the expanded row-codeword group $eCG_A$).

The first error correction decoder 122 may perform the first error correction decoding on each of the received reference codewords. When the number of reference codewords on which the first error correction decoding failed among the received reference codewords exceeds 'q', the first error correction decoder 122 may output a signal indicating that the error correction decoding failed.

When the number of reference codewords on which the first error correction decoding failed among the received reference codewords is equal to or less than 'q', the second error correction decoding may be performed.

The second error correction decoder 124 may perform the second error correction decoding on the MDS codewords corresponding to the row-codeword group (e.g., the row-codeword group $CG_A$ or the row-codeword group $eCG_A$) including the target codeword and the reference codewords using the generator matrix of the MDS code. For example, erasure decoding may be performed during the second error correction decoding.

Figure 4:
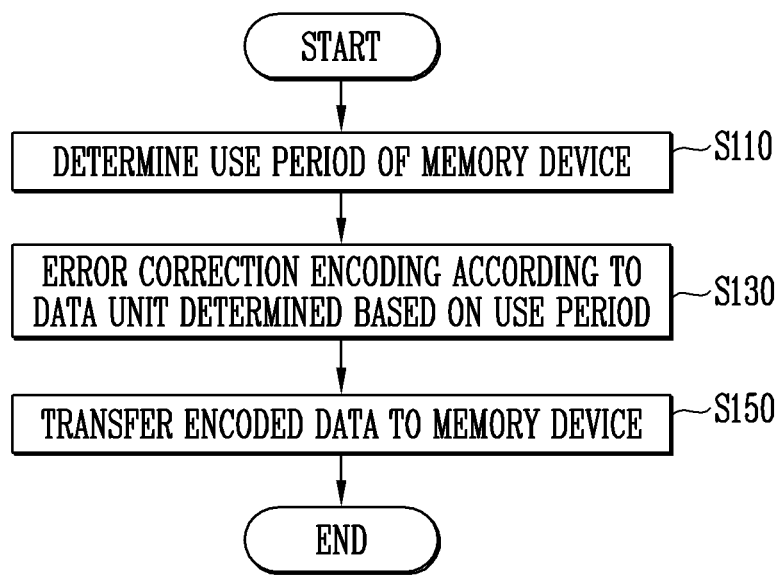
FIG. 4 is a flowchart illustrating an error correction encoding method according to an embodiment of the present disclosure.

FIG. 4 is a flowchart illustrating an error correction encoding method according to an embodiment of the present disclosure. The error correction encoding method shown in FIG. 4 may be performed by the error correction circuit 100 of FIG. 3.

Referring to FIG. 4, an operation method of the error correction circuit according to an embodiment of the present disclosure includes determining a use period of a memory device, i.e., the time or stage in the life of the memory device (S110), performing error correction encoding according to a data unit determined based on the use period (S130), and transferring the encoded data to the memory device (S150).

In operation S110, the period or stage in which the memory device is in from the time of its initiation up to now. This determination of which period or stage the memory device is in its life is for determining the data unit that is a target of error correction encoding, which is based on the degree of deterioration of elements of the memory device. As described above, when the total use period from the time the memory device is initially used is not long, expected error occurrence is relatively low; thus, the second error correction encoding and decoding method as described with reference to FIG. 1 may be used. On the other hand, when the memory device has been used for a relatively long time, expected error occurrence is relatively high due to deterioration of element(s) in the memory device, the second error correction encoding and decoding method as described with reference to FIG. 2 may be used.

The use period of the memory device, i.e., at what time point the memory device is at within its life, may be determined using various methods. As an example, the use period of the memory device may be determined by a timer set from a time when the memory device is produced and initialized. As another example, the use period of the memory device may be determined based on the number of program/erase operations on all memory blocks included in the memory device. When the number of program/erase of the memory blocks is small, it may be determined that the use period of the memory device is short. When the number of program/erase of the memory blocks is large, it may be determined that the use period of the memory device is long.

In operation S130, the data unit of the error correction encoding is determined based on the determined use period. For example, when it is determined that the use period of the memory device is relatively short, each of the row-codeword groups $CG_A$ to $CG_F$ each including 'r' codewords, as described through FIG. 1, may be determined as the data unit of the error correction encoding. In this case, 'p' may be 'r.' As another example, when it is determined that the use period of the memory device is relatively long, each of the row-codeword groups $eCG_A$ and $eCG_B$ each including '3r' codewords, as described with reference to FIG. 2, may be determined as the data unit of the error correction encoding. In this case, 'p' may be '3r.' In operation S130, the error correction encoding is performed according to the determined data unit.

In operation S150, the encoded data is transferred to the memory device through the channel. The transferred data may be programmed into the memory device.

Figure 5:
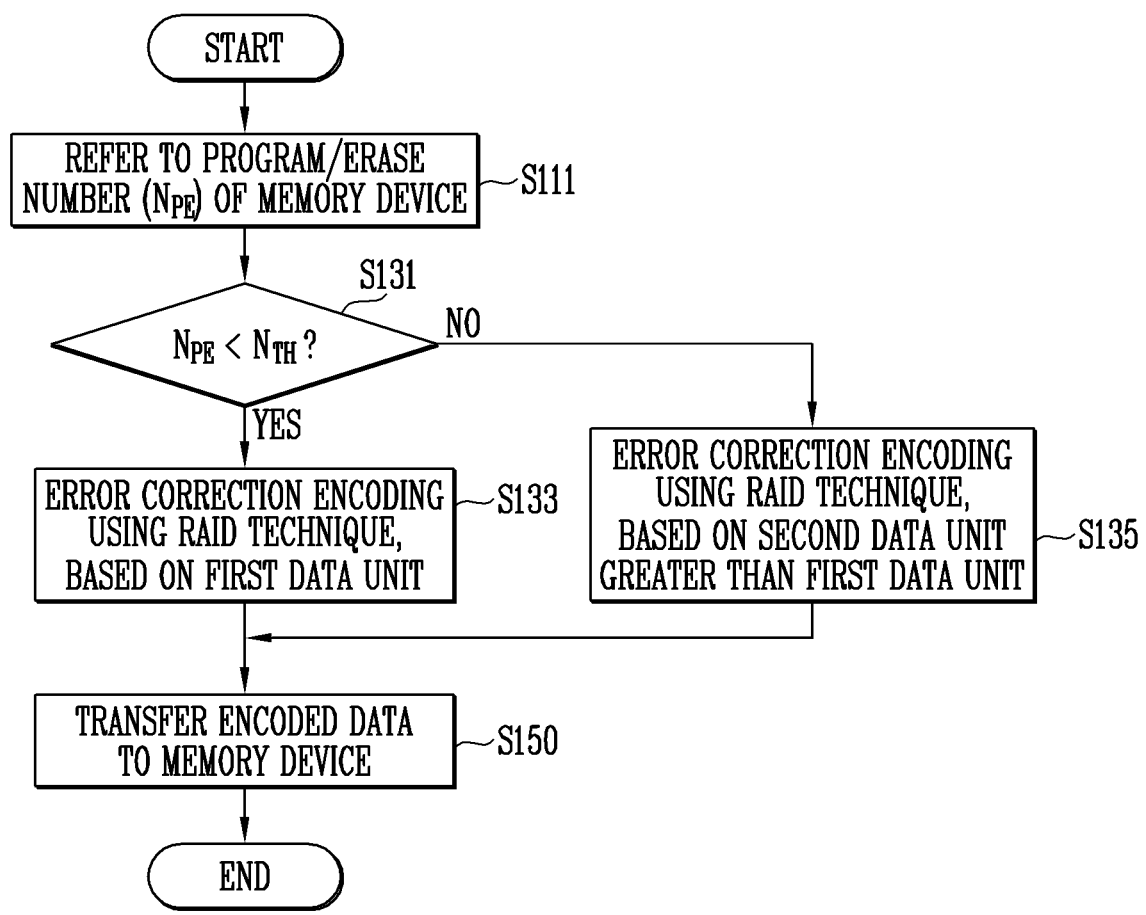
FIG. 5 is a flowchart illustrating an embodiment of an error correction encoding method shown in FIG. 4.

FIG. 5 is a flowchart illustrating an embodiment of the error correction encoding method shown in FIG. 4.

Referring to FIG. 5, in operation S111, a program/erase number $N_{PE}$, indicative of the number of program/erase operations that have been performed on the memory device, is referenced. More specifically, in operation S111, the program/erase number $N_{PE}$ of all memory blocks included in the memory device may be referred. The program/erase number $N_{PE}$ may be updated whenever the memory blocks included in the memory device are programmed/erased. The program/erase number $N_{PE}$ may be stored in the memory device or may be stored in the memory controller.

In operation S131, it is determined whether the program/erase number $N_{PE}$ of the memory device is less than a threshold count NTH, which may be set in advance. When the program/erase number $N_{PE}$ of the memory device is less than the threshold count NTH (S131: Yes), this may mean that the use period of the memory device is relatively short. Therefore, the error correction encoding using the RAID technique may be performed based on the first data unit (S133). In operation S133, the first data unit may be each of the row-codeword groups $CG_A$ to $CG_F$ including 'r' codewords as described through FIG. 1.

When the program/erase number $N_{PE}$ of the memory device is equal to or greater than the threshold count NTH (S131: No), this may mean that the use period of the memory device is relatively long. Therefore, the error correction encoding using the RAID technique may be performed based on the second data unit greater than the first data unit (S135). In operation S135, the second data unit may be each of the row-codeword groups $eCG_A$ and $eCG_B$ including '3r' codewords as described through FIG. 2.

Thereafter, the encoded data may be transferred to the memory device through the channel (S150). The transferred data may be programmed into the memory device.

Figure 6:
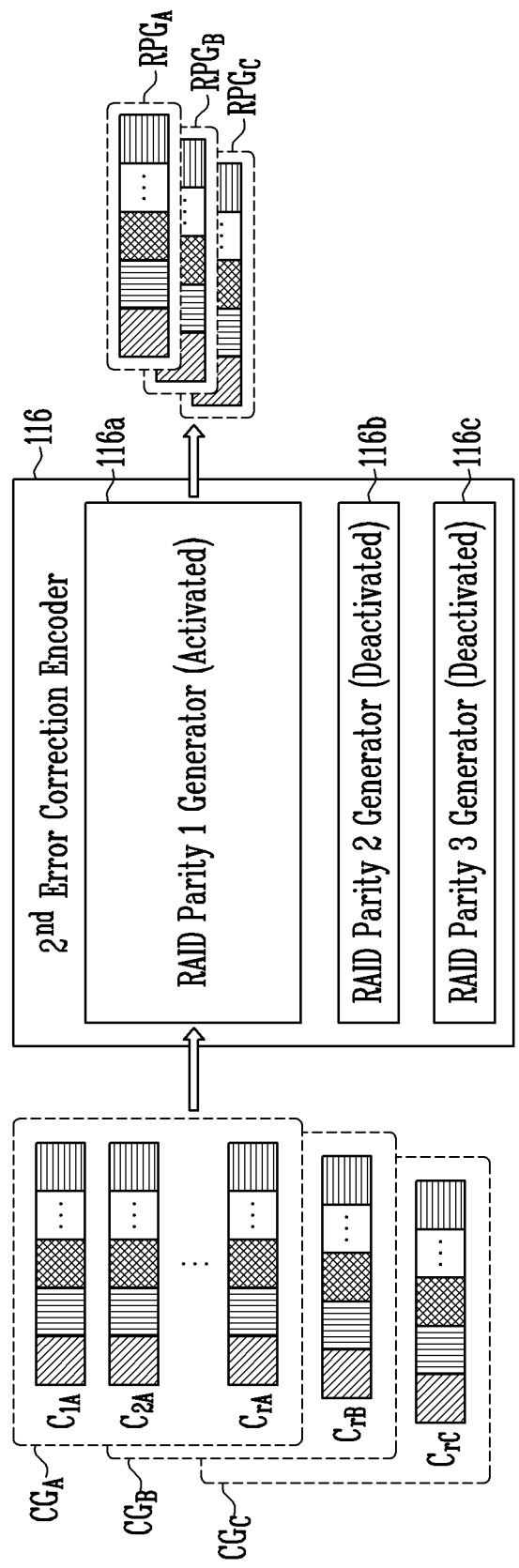
FIG. 6 is an exemplary diagram illustrating an operation of a second error correction encoder according to an embodiment of the present disclosure.

FIG. 6 is an exemplary diagram for describing an operation of the second error correction encoder according to an embodiment of the present disclosure.

The second error correction encoder 116 may include a plurality of RAID parity generators. In FIG. 6, as an example, the second error correction encoder 116 includes three RAID parity generators 116a, 116b, and 116c, but embodiments of the present disclosure are not limited thereto.

The number of RAID parity symbol groups may be determined differently according to the error correction capability, and thus at least one of the RAID parity generators 116a, 116b, and 116c may be deactivated.

FIG. 6 shows an example in which one RAID parity symbol group is generated per row-codeword group when a low error correction capability is used.

The codewords $C_{1A}$ to $C_{rA}$ of the row-codeword group $CG_A$ may be input to a RAID parity 1 generator 116a. The RAID parity 1 generator 116a may perform the second error correction encoding on each of 'n' symbol groups each including the 'r' symbols of the identical column layer among the symbols included in each of the 'r' codewords $C_{1A}$ to $C_{rA}$ to generate a RAID parity symbol group 1 $RPG_A$ including 'n' RAID parity symbols respectively corresponding to the 'n' symbol groups.

As an example, the RAID parity 1 generator 116a may generate the RAID parity symbol group 1 $RPG_A$ by performing an exclusive OR operation on each of the 'n' symbol groups each including the 'r' symbols of the identical column layer among the symbols included in each of the 'r' codewords $C_{1A}$ to $C_{rA}$.

The second error correction encoding may be performed on the row-codeword groups $CG_B$ and $CG_C$ in the same principle to generate a RAID parity symbol group 2 $RPG_B$ and a RAID parity symbol group 3 $RPG_C$.

Figure 7:
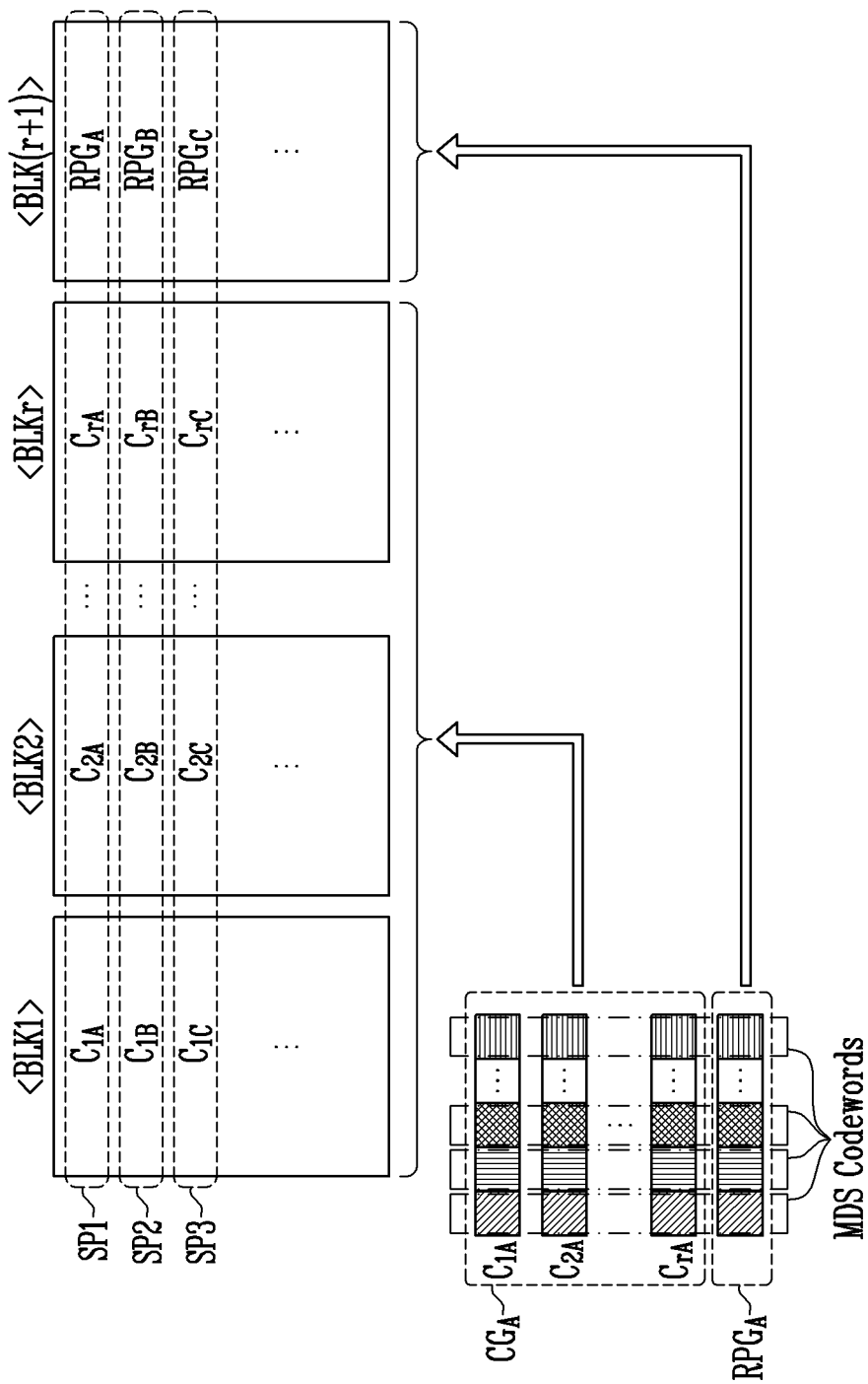
FIG. 7 is an exemplary diagram illustrating a maximum distance separable (MDS) codeword generated according to second error correction encoding according to an embodiment of the present disclosure.

FIG. 7 is an exemplary diagram illustrating an MDS codeword generated according to the second error correction encoding according to an embodiment of the present disclosure.

As described above with reference to FIG. 6, when the second error correction encoding is performed on each of the 'n' symbol groups each including the 'r' symbols of the identical column layer among the symbols included in each of the codewords $C_{1A}$ to $C_{rA}$ of the row-codeword group $CG_A$, the RAID parity symbol group $RPG_A$ including 'n' RAID parity symbols respectively corresponding to the 'n' symbol groups may be generated.

One symbol group of the 'r' symbols of the row-codeword group $CG_A$ and a corresponding RAID parity symbol of the identical column layer of the RAID parity symbol group $RPG_A$ may configure one MDS codeword. That is, as a result of the second error correction encoding on the single row-codeword group $CG_A$ including 'n' symbol groups, generated may be the single RAID parity symbol group $RPG_A$ including 'n' RAID parity symbols respectively corresponding to the 'n' symbol groups. The 'n' groups each including the 'r' symbols of the row-codeword group $CG_A$ and a corresponding RAID parity symbol of the RAID parity symbol group $RPG_A$ may be 'n' MDS codewords. As illustrated in FIG. 7, the second error correction encoding on the single row-codeword group $CG_A$ including the 'r' codewords $C_{1A}$ to $C_{rA}$ may result in the 'n' MDS codewords.

When the error correction circuit is applied to the memory system, the row-codeword group $CG_A$ and the RAID parity symbol group $RPG_A$ may be stored in one super page. The one super page may be configured of a physical page or a logical page included in each of a plurality of memory blocks BLK1 to BLK(r+1) included in the memory system.

In an embodiment, a size of each of the codewords $C_{1A}$ to $C_{rA}$ may be the same as a size of the logical page. In this case, each of super pages SP1, SP2, SP3, etc. shown in FIG. 7 may be configured of the logical page included in each of the plurality of memory blocks BLK1 to BLK(r+1) included in the memory system.

Figure 8:
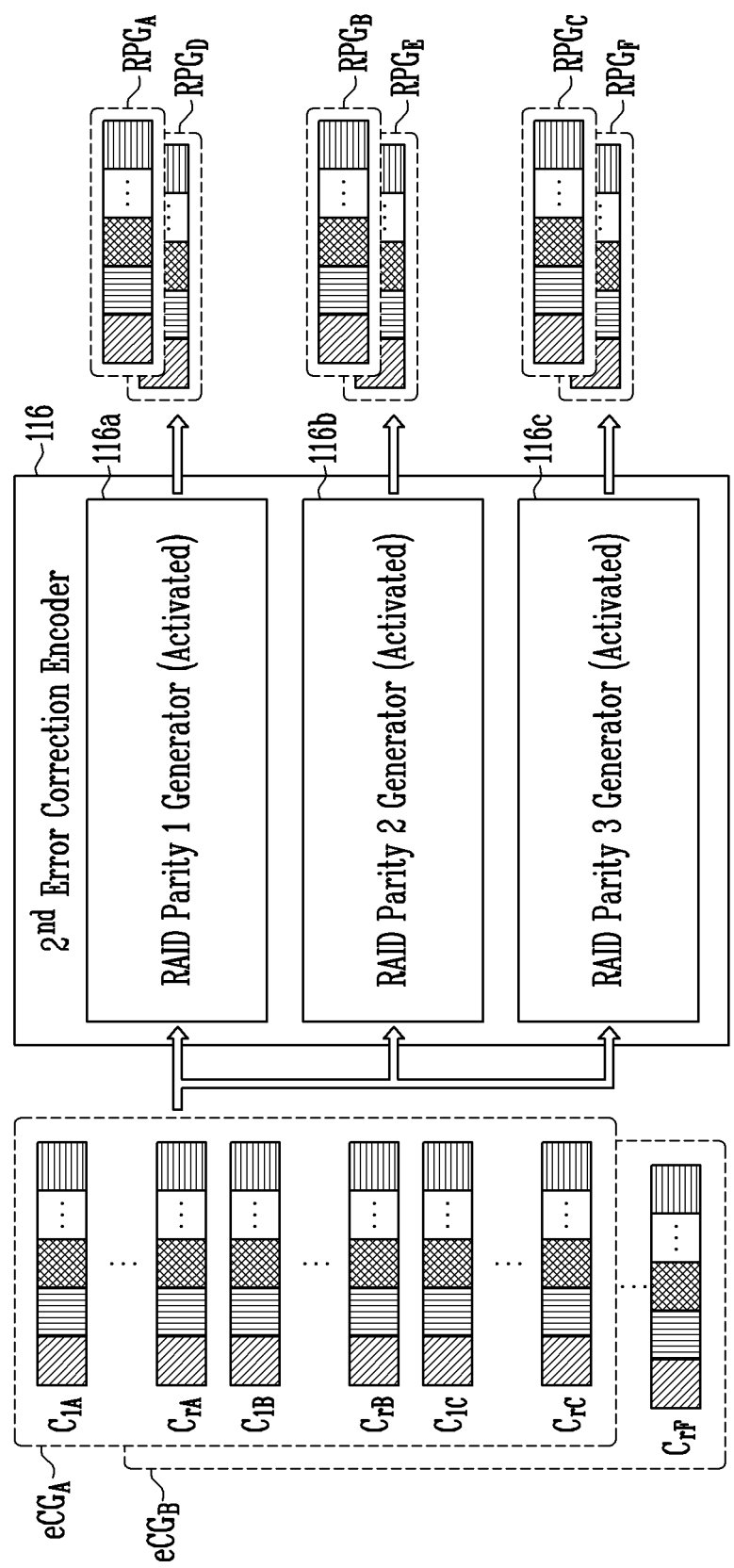
FIG. 8 is an exemplary diagram illustrating operation of the second error correction encoder according to an embodiment of the present disclosure.

FIG. 8 is an exemplary diagram illustrating operation of the second error correction encoder according to an embodiment of the present disclosure.

The second error correction encoder 116 may include a plurality of RAID parity generators. In FIG. 8, as an example, an example in which the second error correction encoder 116 includes three RAID parity generators 116a, 116b, and 116c is shown, but embodiments of the present disclosure are not limited thereto.

The number of RAID parity symbol groups may vary according to the error correction capability, and thus at least one of the RAID parity generators 116a, 116b, and 116c may be deactivated.

FIG. 8 shows an example in which an expanded RAID parity symbol groups 1 and 2 $eRPG_1$ and $eRPG_2$ respectively including three RAID parity symbol groups $RPG_A$, $RPG_B$, and $RPG_C$ and $RPG_D$, $RPG_E$, and $RPG_F$ are generated respectively for the row-codeword groups $eCG_A$ and $eCG_B$ when a high error correction capability is used.

The codewords $C_{1A}$ to $C_{rA}$, $C_{1B}$ to $C_{rB}$, and $C_{1C}$ to $C_{rC}$ of the row-codeword group $eCG_A$ may be input to the RAID parity generators 116a, 116b, and 116c. Also, the codewords $C_{1D}$ to $C_{rD}$, $C_{1E}$ to $C_{rE}$, and $C_{1F}$ to $C_{rF}$ of the row-codeword group $eCG_B$ may be input to the RAID parity generators 116a, 116b, and 116c. Each of the RAID parity generators 116a, 116b, and 116c may perform the second error correction encoding on each of symbol groups each including the symbols of the identical column layer among the symbols included in the codewords $C_{1A}$ to $C_{rA}$, $C_{1B}$ to $C_{rB}$, and $C_{1C}$ to $C_{rC}$ to generate the expanded RAID parity symbol group 1 $eRPG_1$ having RAID parity symbol groups $RPG_A$, $RPG_B$, and $RPG_C$. Also, each of the RAID parity generators 116a, 116b, and 116c may perform the second error correction encoding on each of symbol groups each including the symbols of the identical column layer among the symbols in each of the row-codeword groups $CG_D$ to $CG_F$ respectively including the codewords $C_{1D}$ to $C_{rD}$, $C_{1E}$ to $C_{rE}$, and $C_{1F}$ to $C_{rF}$ to generate the expanded RAID parity symbol group 2 $eRPG_2$ having RAID parity symbol groups $RPG_D$, $RPG_E$, and $RPG_F$.

In an embodiment, the RAID parity generators 116a, 116b, and 116c may operate in parallel, and each of the RAID parity generators 116a, 116b, and 116c may generate a RAID parity symbol group corresponding thereto.

For example, the RAID parity 1 generator 116a may generate the RAID parity symbol group 1 $RPG_A$ by performing an exclusive OR operation on each of the 'n' symbol groups each including the '3r' symbols of the identical column layer among the symbols included in the codewords $C_{1A}$ to $C_{rA}$, $C_{1B}$ to $C_{rB}$, and $C_{1C}$ to $C_{rC}$ within the row-codeword group $eCG_A$. In addition, the RAID parity 1 generator 116a may generate the RAID parity symbol group 4 $RPG_D$ by performing an exclusive OR operation on each of the 'n' symbol groups each including the '3r' symbols of the identical column layer among the symbols included in the codewords $C_{1D}$ to $C_{rD}$, $C_{1E}$ to $C_{rE}$, and $C_{1F}$ to $C_{rF}$ within the row-codeword group $eCG_B$.

For example, the RAID parity 2 generator 116b may generate the RAID parity symbol group 2 $RPG_B$ by performing a product of the 'n' symbol groups each including the '3r' symbols of the identical column layer among the symbols included in the codewords $C_{1A}$ to $C_{rA}$, $C_{1B}$ to $C_{rB}$, and $C_{1C}$ to $C_{rC}$ within the row-codeword group $eCG_A$ and entries of a column corresponding to the PAID parity 2 generator 116b within the generator matrix of the MDS code. In addition, the RAID parity 2 generator 116b may generate the RAID parity symbol group 5 $RPG_E$ by performing a product of the 'n' symbol groups each including the '3r' symbols of the identical column layer among the symbols included in the codewords $C_{1D}$ to $C_{rD}$, $C_{1E}$ to $C_{rE}$, and $C_{1F}$ to $C_{rF}$ within the row-codeword group $eCG_B$ and entries of a column corresponding to the PAID parity 2 generator 116b within the generator matrix of the MDS code.

For example, the RAID parity 3 generator 116c may generate the RAID parity symbol group 3 $RPG_C$ by performing a product of the 'n' symbol groups each including the '3r' symbols of the identical column layer among the symbols included in the codewords $C_{1A}$ to $C_{rA}$, $C_{1B}$ to $C_{rB}$, and $C_{1C}$ to $C_{rC}$ within the row-codeword group $eCG_A$ and entries of a column corresponding to the RAID parity 3 generator 116c within the generator matrix of the MDS code. In addition, the RAID parity 3 generator 116c may generate the RAID parity symbol group 6 $RPG_F$ by performing a product of the 'n' symbol groups each including the '3r' symbols of the identical column layer among the symbols included in the codewords $C_{1D}$ to $C_{rD}$, $C_{1E}$ to $C_{rE}$, and $C_{1F}$ to $C_{rF}$ within the row-codeword group $eCG_B$ and entries of a column corresponding to the PAID parity 3 generator 116c within the generator matrix of the MDS code.

Figure 9:
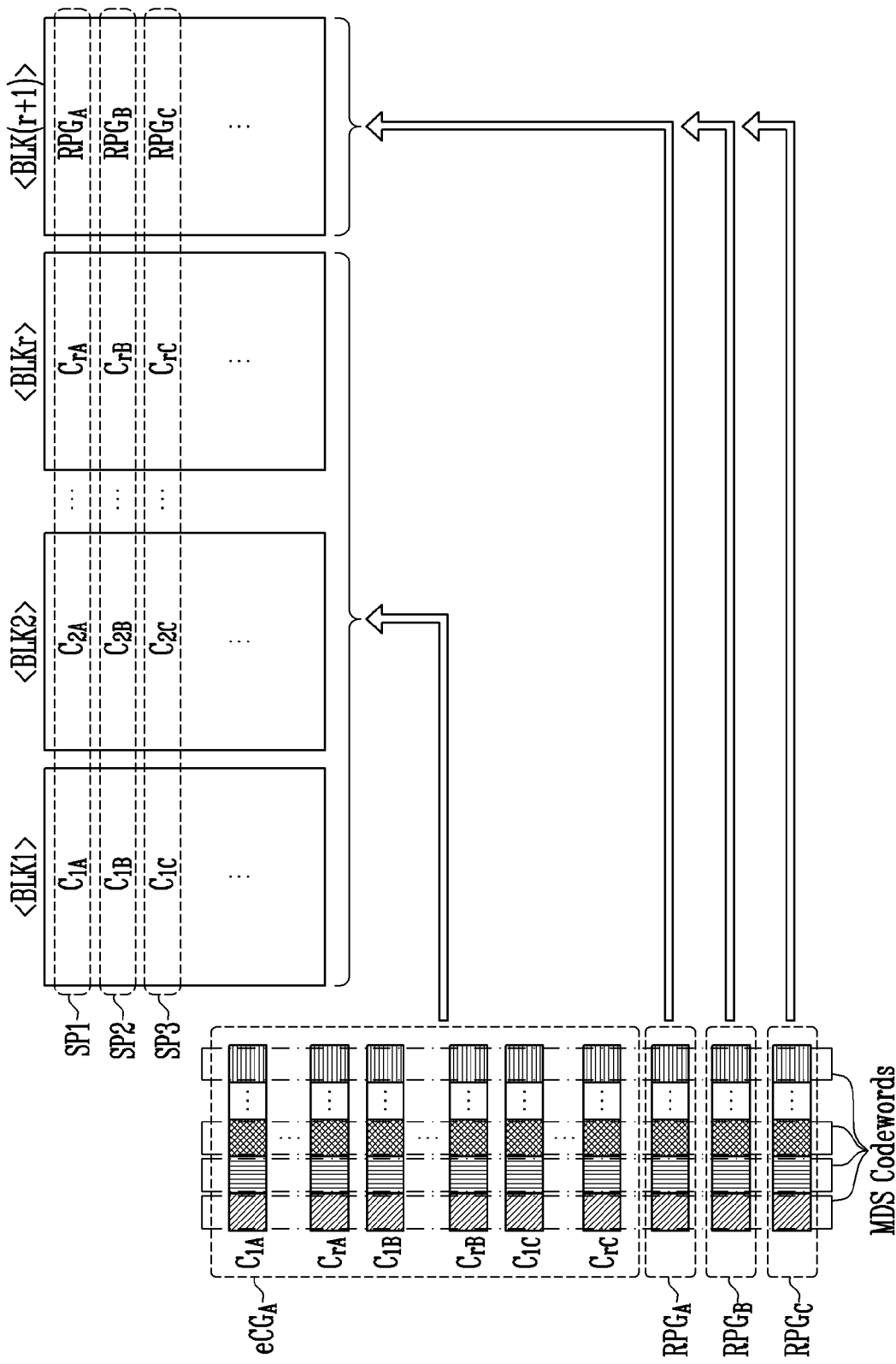
FIG. 9 is an exemplary diagram illustrating an MDS codeword generated according to the second error correction encoding according to an embodiment of the present disclosure.

FIG. 9 is an exemplary diagram illustrating an MDS codeword generated according to the second error correction encoding according to an embodiment of the present disclosure.

As described with reference to FIG. 9, when the second error correction encoding is performed on each of the 'n' symbol groups each including the '3r' symbols of the identical column layer among the symbols included in each of the codewords $C_{1A}$ to $C_{rA}$, $C_{1B}$ to $C_{rB}$, and $C_{1C}$ to $C_{rC}$ of the row-codeword group $eCG_A$, the expanded RAID parity symbol group 1 $eRPG_1$ including the RAID parity symbol groups $RPG_A$, $RPG_B$, and $RPG_C$ each including 'n' RAID parity symbols respectively corresponding to the 'n' symbol groups may be generated.

The RAID parity symbol group 1 $RPG_A$ may be generated by performing the exclusive OR operation on each of the 'n' symbol groups each including the '3r' symbols of the identical column layer among the symbols in the codewords $C_{1A}$ to $C_{rA}$, $C_{1B}$ to $C_{rB}$, and $C_{1C}$ to $C_{rC}$ within the row-codeword group $eCG_A$. In addition, one symbol group of the '3r' symbols of the row-codeword group $eCG_A$ and corresponding RAID parity symbols of the identical column layer of the respective RAID parity symbol groups $RPG_A$, $RPG_B$ and $RPG_C$ may configure one MDS codeword. That is, as a result of the second error correction encoding on the single row-codeword group $eCG_A$ including 'n' symbol groups (each including the '3r' symbols), generated is the single expanded RAID parity symbol group 1 $eRPG_1$ including the RAID parity symbol groups $RPG_A$, $RPG_B$, and $RPG_C$ each including 'n' RAID parity symbols respectively corresponding to the 'n' the symbol groups. The 'n' groups each including the '3r' symbols of the row-codeword group $eCG_A$ and corresponding RAID parity symbols of the respective RAID parity symbol groups $RPG_A$, $RPG_B$, and $RPG_C$ may be 'n' MDS codewords. As illustrated in FIG. 9, the second error correction encoding on the single row-codeword group $eCG_A$ including the '3r' codewords $C_{1A}$ to $C_{rA}$, $C_{1B}$ to $C_{rB}$, and $C_{1C}$ to $C_{rC}$ may result in the 'n' MDS codewords.

When the error correction circuit is applied to the memory system, the row-codeword group $eCG_A$ and the RAID parity symbol groups $RPG_A$, $RPG_A$, and $RPG_C$ may be divided and stored in three super pages. One super page may be configured of the physical page or the logical page included in each of the plurality of memory blocks BLK1 to BLK(r+1) included in the memory system.

In an embodiment, a size of each of the codewords $C_{1A}$ to $C_{rA}$ may be the same as the size of the logical page. In this case, each of super pages SP1, SP2, SP3, etc. shown in FIG. 9 may be configured of the logical page included in each of the plurality of memory blocks BLK1 to BLK(r+1) included in the memory system.

For example, when the memory cells included in the memory blocks operate as a triple-level cell (TLC), one super physical page may include three super pages SP1, SP2, and SP3. That is, one super physical page may include three super logical pages. In conclusion, the row-codeword group $eCG_A$ and the expanded RAID parity symbol group 1 $eRPG_1$ corresponding thereto may configure one super physical page.

For example, when data is stored in a memory device including a TLC, as shown in FIG. 9, three super logical pages may store one row-codeword group $eCG_A$ and the expanded RAID parity symbol group $eRPG_1$ corresponding thereto. Therefore, since the row-codeword group $eCG_A$ and the expanded RAID parity symbol group 1 $eRPG_1$ corresponding thereto are configured in a limit that does not increase a latency and a storage capacity for storing and processing the super logical pages, additional resources for this are not required.

Figure 10:
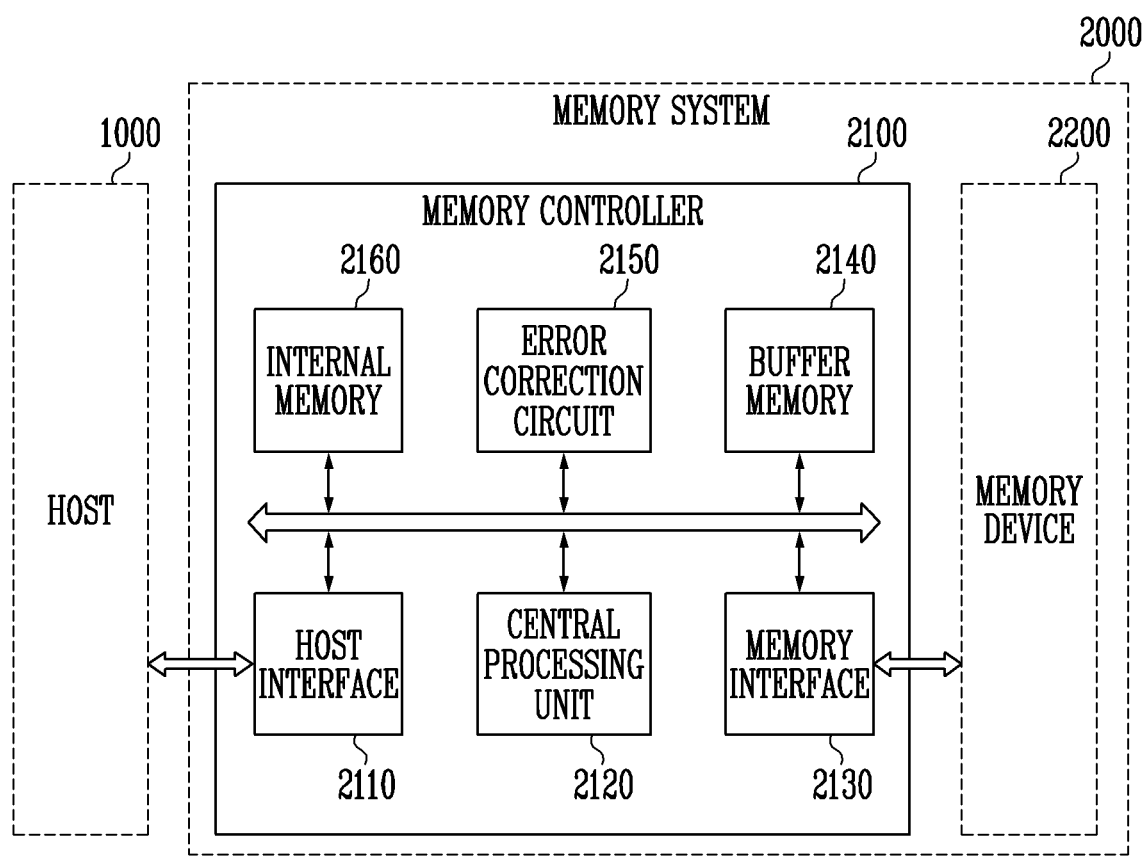
FIG. 10 is an exemplary diagram illustrating a memory system according to an embodiment of the present disclosure.

FIG. 10 is an exemplary diagram illustrating a memory system according to an embodiment of the present disclosure.

The memory system 2000 may include a memory device 2200 in which data is stored and a memory controller 2100 that controls the memory device 2200 according to a request of a host 1000.

The host 1000 may be a device or a system that stores data in the memory system 2000 or retrieves data from the memory system 2000. For example, the host 1000 may implemented by any of a computer, a portable digital device, a tablet, a digital camera, a digital audio player, a television, a wireless communication device, and a cellular phone, but embodiments of the present disclosure are not limited thereto.

The memory controller 2100 may control overall operation of the memory system 2000. The memory controller 2100 may perform various more specific operations according to a request from the host 1000. The memory controller 2100 may perform a program operation of storing data in the memory device 2200, a read operation of reading data stored in the memory device 2200, and/or an erase operation of erasing the data stored in the memory device 2200.

The memory controller 2100 may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may communicate with the host 1000 using any of various interface protocols. For example, the host interface 2110 may communicate with the host 1000 using at least one interface among a non-volatile memory express (NVMe), a peripheral component interconnect-express (PCI-E), an advanced technology attachment (ATA), a serial ATA (SATA), a parallel ATA (PATA), a universal serial bus (USB), a multi-media card (MMC), an enhanced small disk interface (ESDI), integrated drive electronics (IDE), a mobile industry processor interface (MIPI), a universal flash storage (UFS), a small computer system interface (SCSI), and a serial attached SCSI (SAS), but embodiments of the present disclosure are not limited thereto.

The central processing unit 2120 may perform various operations or generate a command and an addresses to control the memory device 2200. For example, the central processing unit 2120 may generate various commands and addresses for the program operation, the read operation, the erase operation, and the like, according to the request received from the host 1000, and transmit the commands and the addresses to the memory device 2200.

The central processing unit 2120 may convert a logical address included in the request received from the host 1000 into a physical address in order to control an operation of the memory device 2200. The central processing unit 2120 may convert the logical address into the physical address or convert the physical address into the logical address using an address mapping table stored in the internal memory 2160. The central processing unit 2120 may update the address mapping table when new data is programmed in the memory device 2200 or data stored in the memory device 2200 is erased.

The central processing unit 2120 may randomize data during the program operation and de-randomize the data during the read operation.

The memory interface 2130 may communicate with the memory device 2200 using any of various interface protocols.

The buffer memory 2140 may temporarily store data while the memory controller 2100 controls the memory device 2200. For example, program data received from the host 1000 may be temporarily stored in the buffer memory 2140 until the program operation is completed. In addition, during the read operation, data read from the memory device 2200 may be temporarily stored in the buffer memory 2140.

The error correction circuit 2150 may perform error correction encoding on the program data and error correction decoding on the read data. The error correction circuit 2150 may be the same as the error correction circuit 100 shown in FIG. 3.

The internal memory 2160 may be used as a storage that stores various pieces of information for an operation of the memory controller 2100. The internal memory 2160 may store a plurality of tables. For example, the internal memory 2160 may store an address mapping table in which logical addresses and physical addresses are mapped to each other.

The memory device 2200 may be configured as a volatile memory device in which stored data is lost when power supply is cut off, or a non-volatile memory device in which stored data is maintained even though power supply is cut off. The memory device 2200 may perform a program operation, a read operation, an erase operation, and the like according to control of the memory controller 2100.

The memory device 2200 may include at least one storage area for storing data. The storage area may correspond to one page including a plurality of memory cells, one memory block including a plurality of pages, one plane including a plurality of memory blocks, or one die including a plurality of planes. However, embodiments of the present disclosure are not limited thereto.

Figure 11:
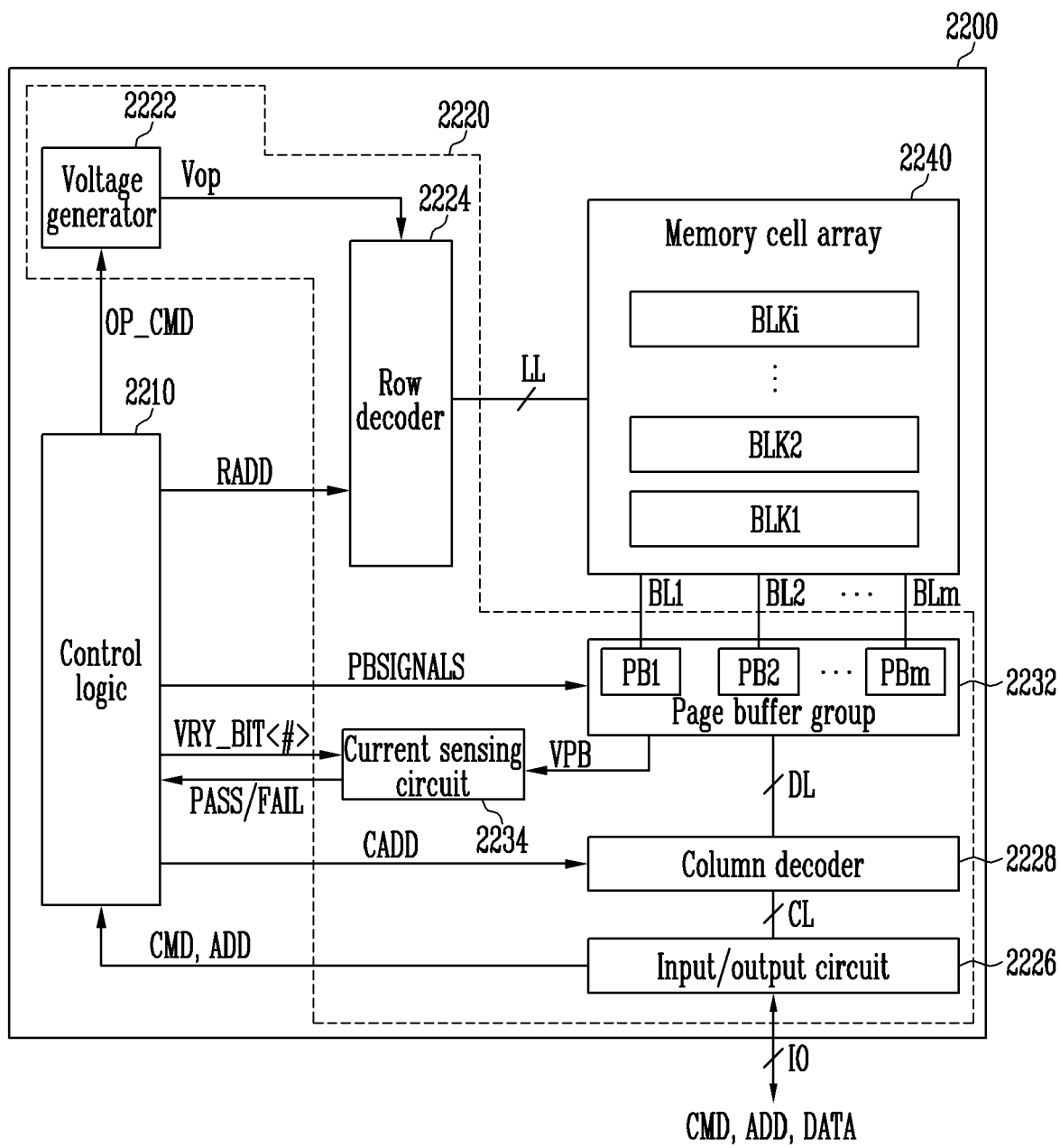
FIG. 11 is a diagram illustrating a memory device according to an embodiment.

FIG. 11 is a diagram illustrating a memory device according to an embodiment.

The memory device 2200 may include control logic 2210, a peripheral circuit 2220, and a memory cell array 2240. The peripheral circuit 2220 may include a voltage generation circuit 2222, a row decoder 2224, an input/output circuit 2226, a column decoder 2228, a page buffer group 2232, and a current sensing circuit 2234.

The control logic 2210 may control the peripheral circuit 2220 under the control of the memory controller 2100 shown in FIG. 10.

The control logic 2210 may control the peripheral circuit 2220 in response to the command CMD and the address ADD received from the memory controller 2100 through the input/output circuit 2226. For example, the control logic 2210 may output an operation signal OP_CMD, a row address RADD, a column address CADD, page buffer control signals PBSIGNALS, and a permission bit VRY_BIT<#> in response to the command CMD and the address ADD. The control logic 2210 may determine whether a verify operation has passed or failed in response to a pass signal PASS or a fail signal FAIL received from the current sensing circuit 2234.

The peripheral circuit 2220 may perform a program operation of storing data in the memory cell array 2240, a read operation of outputting data stored in the memory cell array 2240, and an erase operation of erasing the data stored in the memory cell array 2240.

The voltage generation circuit 2222 may generate various operation voltages Vop used for the program operation, the read operation, and the erase operation in response to the operation signal OP_CMD received from the control logic 2210. For example, the voltage generation circuit 2222 may transfer a program voltage, a verify voltage, a pass voltage, a read voltage, an erase voltage, a turn-on voltage, and the like to the row decoder 2224.

The row decoder 2224 may transfer the operation voltages Vop to local lines LL connected to a selected memory block among memory blocks included in the memory cell array 2240 in response to the row address RADD received from the control logic 2210. The local lines LL may include local word lines, local drain select lines, and local source select lines. In addition, the local lines LL may include various lines connected to a memory block such as a source line.

The input/output circuit 2226 may transfer the command CMD and the address ADD received from the memory controller through input/output lines JO to the control logic 2210 or exchange data DATA with the column decoder 2228.

The column decoder 2228 may transfer data between the input/output circuit 2226 and the page buffer group 2232 in response to the column address CADD received from the control logic 2210. For example, the column decoder 2228 may exchange data with page buffers PB1 to PBm through data lines DL, or exchange data with the input/output circuit 2226 through the column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each bit line. The page buffers PB1 to PBm may operate in response to the page buffer control signals PBSIGNALS received from the control logic 2210. For example, during the program operation, the page buffers PB1 to PBm may temporarily store program data received from the memory controller and adjust a voltage applied to the bit lines BL1 to BLm according to the program data. In addition, during the read operation, the page buffers PB1 to PBm may temporarily store data received through the bit lines BL1 to BLm or may sense a voltage or a current of the bit lines BL1 to BLm.

During the read operation or the verify operation, the current sensing circuit 2234 may generate a reference current in response to the permission bit VRY_BTI<#> received from the control logic 2210, and compare a reference voltage generated by the reference current with a sensing voltage VPB received from the page buffer group 2232 to output the pass signal PASS or the fail signal FAIL.

The memory cell array 2240 may include a plurality of memory blocks BLK1 to BLKi in which data is stored. The memory blocks BLK1 to BLKi may store user data and various pieces of information for the operation of the memory device 2200. The memory blocks BLK1 to BLKi may be implemented in a two-dimensional structure or a three-dimensional structure, and may be configured identically to each other.

Figure 12:
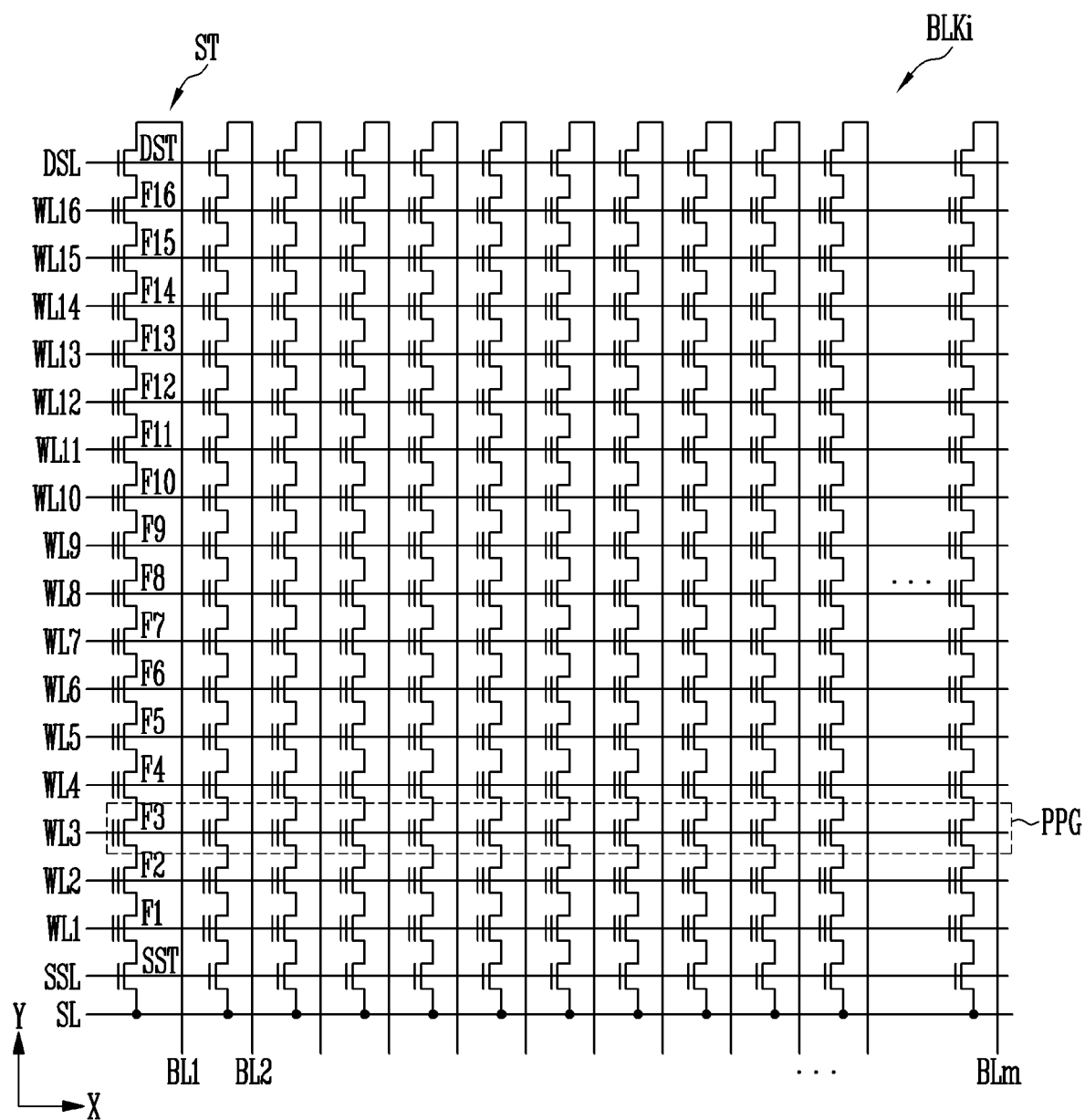
FIG. 12 is an exemplary diagram illustrating a memory block.

FIG. 12 is an exemplary diagram illustrating a memory block.

The memory cell array may include a plurality of memory blocks, and FIG. 12 shows a representative memory block BLKi among the plurality of memory blocks.

A plurality of word lines arranged in parallel to each other between a first select line and a second select line may be connected to the memory block BLKi. Here, the first select line may be a source select line SSL, and the second select line may be a drain select line DSL. Specifically, the memory block BLKi may include a plurality of strings ST connected between the bit lines BL1 to BLm and a source line SL. The bit lines BL1 to BLm may be connected to the strings ST, respectively, and the source line SL may be commonly connected to the strings ST. Since the strings ST may be configured identically to each other, the string ST connected to the first bit line BL1 is specifically described as an example.

The string ST may include a source select transistor SST, a plurality of memory cells F1 to F16, and a drain select transistor DST connected in series between the source line SL and the first bit line BL1. One string ST may include at least one source select transistor SST and at least one drain select transistor DST, and may include more than the 16 memory cells F1 to F16 shown in the drawing.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in different strings ST may be connected to the source select line SSL, gates of the drain select transistors DST may be connected to the drain select line DSL, and gates of the memory cells F1 to F16 may be connected to a plurality of word lines WL1 to WL16. A group of memory cells connected to the same word line among memory cells included in different strings ST may be referred to as a physical page PPG. Therefore, the memory block BLKi may include as many physical pages PPG as the number of word lines WL1 to WL16.

Figure 13:
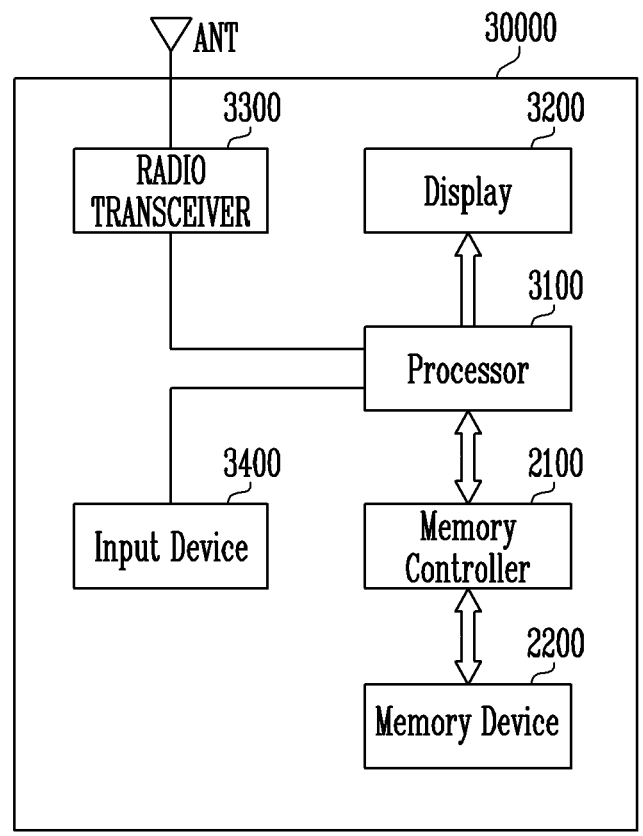
FIG. 13 is a diagram illustrating another example of the memory system including a memory controller shown in FIG. 10.

FIG. 13 is a diagram illustrating another example of the memory system including the memory controller shown in FIG. 10.

Referring to FIG. 13, the memory system 30000 may be implemented as a cellular phone, a smart phone, a tablet, a personal computer (PC), a personal digital assistant (PDA), or a wireless communication device. The memory system 30000 may include the memory device 2200 and the memory controller 2100 capable of controlling operation of the memory device 2200.

The memory controller 2100 may control a data access operation, for example, a program operation, an erase operation, a read operation, or the like, of the memory device 2200 under control of a processor 3100.

Data programmed in the memory device 2200 may be output through a display 3200 under the control of the memory controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 2100 or the display 3200. The memory controller 2100 may transmit the signal processed by the processor 3100 to the memory device 2200. In addition, the radio transceiver 3300 may convert a signal output from the processor 3100 into a radio signal, and output the radio signal to an external device through the antenna ANT.

An input device 3400 may be a device capable of inputting a control signal for controlling the operation of the processor 3100 or data to be processed by the processor 3100. The input device 3400 may be implemented as a pointing device such as a touch pad or a computer mouse, a keypad, a keyboard, or an image sensor.

The processor 3100 may control an operation of the display 3200 so that data output from the memory controller 2100, data output from the radio transceiver 3300, or data output from the input device 3400 is output through the display 3200.

According to an embodiment, the memory controller 2100 capable of controlling the operation of memory device 2200 may be implemented as a part of the processor 3100 and may be implemented as a chip separate from the processor 3100.

Figure 14:
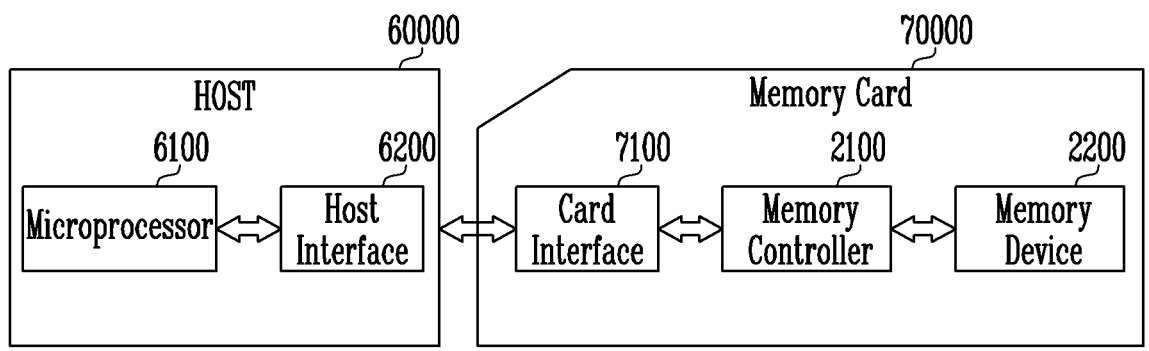
FIG. 14 is a diagram illustrating another example of the memory system including the memory controller shown in FIG. 10.

FIG. 14 is a diagram illustrating another example of the memory system including the memory controller shown in FIG. 10.

Referring to FIG. 14, the memory system 70000 may be implemented as a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be a secure digital (SD) card interface or a multi-media card (MMC) interface, but embodiments of the disclosure are not limited thereto.

The card interface 7100 may interface data exchange between a host 60000 and the memory controller 2100 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the memory controller 2100 under control of a microprocessor 6100.

Although specific embodiments have been illustrated and described, those skilled in the art will understand in view of the present disclosure that various changes and modifications may be made without departing from the scope and technical spirit of the present invention. Therefore, the scope of the present invention is not limited to the above-described embodiments. Rather, the present invention encompasses all variations that fall within the scope of the claims including their equivalents.

What is claimed is:

1. An error correction circuit performing error correction encoding on a plurality of messages to be stored in a memory device, the error correction circuit comprising:
a first error correction encoder configured to generate a plurality of codewords by performing first error correction encoding on each of the plurality of messages; and
a second error correction encoder configured to perform a-second error correction encoding by performing an exclusive OR operation on symbols of an identical column layer within the codewords,
wherein the second error correction encoder determines a data unit as a target of the second error correction encoding, based on a number of program/erase of memory blocks included in the memory device.

2. The error correction circuit of claim 1, wherein when the number of program/erase of the memory blocks included in the memory device is less than a threshold count, the second error correction encoder performs the second error correction encoding based on a first data unit.

3. The error correction circuit of claim 2, wherein a first redundant array of independent disk (RAID) parity symbol group is generated by performing the exclusive OR operation on the symbols of the identical column layer of the codewords by the second error correction encoding based on the first data unit.

4. The error correction circuit of claim 2, wherein when the number of program/erase of the memory blocks included in the memory device is equal to or greater than the threshold count, the second error correction encoder performs the second error correction encoding based on a second data unit greater than the first data unit.

5. The error correction circuit of claim 4, wherein a first RAID parity symbol group is generated by performing the exclusive OR operation on the symbols of the identical column layer of the codewords, and a second RAID parity symbol group is generated according to Reed-Solomon error correction encoding on the codewords, by the second error correction encoding based on the second data unit.

6. The error correction circuit of claim 3,
wherein each of the plurality of codewords configures a logical page in the memory device, and
wherein the plurality of codewords included in the first data unit and a RAID parity symbol group corresponding to the plurality of codewords in the first data unit configure a super logical page.

7. The error correction circuit of claim 5,
wherein each of the plurality of codewords configures a logical page in the memory device, and
a plurality of codewords included in the second data unit and a RAID parity symbol group corresponding to the plurality of codewords in the second data unit configure a super physical page.

8. The error correction circuit of claim 3, further comprising:
a first error correction decoder configured to perform first error correction decoding on each of the plurality of codewords read from the memory device; and
a second error correction decoder configured to perform a-second error correction decoding by performing an exclusive OR operation on remaining codewords except for a codeword for which the first error correction decoding failed among the plurality of codewords and symbols of an identical column layer of the first RAID parity symbol group.

9. A method of performing error correction encoding on a plurality of messages to be stored in a memory device, the method comprising:
generating a plurality of codewords by performing first error correction encoding on each of the plurality of messages; and
performing second error correction encoding of performing an exclusive OR operation on symbols of an identical column layer within the codewords,
wherein a data unit as a target of the second error correction encoding is determined based on a number of program/erase of memory blocks included in the memory device.

10. The method of claim 9, wherein the performing the second error correction encoding comprises:
referring to the number of program/erase of the memory blocks included in the memory device;
determining whether the number of program/erase is less than a threshold count; and
generating a redundant array of independent disk (RAID) parity symbol group according to the data unit determined based on a result of the determining operation.

11. The method of claim 10, wherein the generating of the RAID parity symbol group comprises, when the number of program/erase of the memory blocks in the memory device is less than the threshold count, generating a first RAID parity symbol group by performing an exclusive OR operation on symbols of the identical column layer of the codewords included in a first data unit determined based on the result of the determining operation.

12. The method of claim 10, wherein the generating of the RAID parity symbol group comprises generating, when the number of program/erase of the memory blocks in the memory device is equal to or greater than the threshold count, a second RAID parity symbol group by performing an exclusive OR operation on symbols of the identical column layer of the codewords included in a second data unit determined based on the result of the determining operation, the second data unit being greater than the first data unit.

13. The method of claim 12, wherein the generating the RAID parity symbol group further comprises, when the number of program/erase of the memory blocks in the memory device is equal to or greater than the threshold count, generating a third RAID parity symbol group by performing Reed-Solomon error correction encoding on the codewords included in the second data unit.

14. An operating method of an error correction encoder, the operating method comprising:
performing a first error correction encoding operation on a message to generate a plurality of codewords;
grouping the codewords into a plurality of groups, a number of the codewords in each of the groups depending on a number of program/erase of memory blocks in a memory device; and
performing a second error correction encoding operation on the respective groups to generate a plurality of maximum distance separable (MDS) codewords,
wherein the MDS codewords are to be stored into the memory device.

* * * * *